(12) United States Patent
Oh

(10) Patent No.: US 6,373,083 B1
(45) Date of Patent: Apr. 16, 2002

(54) CAPACITOR FOR SEMICONDUCTOR DEVICE AND FABRICATION METHOD THEREOF

(75) Inventor: Bo-Seok Oh, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/392,632

(22) Filed: Sep. 9, 1999

(30) Foreign Application Priority Data

Apr. 20, 1999 (KR) ............................................. 99-14026

(51) Int. Cl.$^7$ ............................................. H01L 29/32
(52) U.S. Cl. ........................ 257/296; 257/298; 257/304; 257/532; 257/534; 438/239; 438/233; 438/234
(58) Field of Search ................................ 257/304, 532, 257/534, 298; 438/239, 243, 244

(56) References Cited

U.S. PATENT DOCUMENTS 5,770,876 A * 6/1998 Lam et al. ................... 257/304
5,959,326 A * 9/1999 Aiso et al. ................... 257/304
6,015,729 A * 1/2000 Shirley et al. ............... 257/532

* cited by examiner

Primary Examiner—Edward Wojciechowicz
(74) Attorney, Agent, or Firm—Morgan, Lewis & Bockius LLP

(57) ABSTRACT

A capacitor having variable capacitance for a semiconductor device is formed on a device isolation area. A trench is formed in a semiconductor substrate for device isolation and a device isolating insulating film in which a bottom electrode of the capacitor is buried is formed in the trench. A first dielectric film is formed on the buried bottom electrode, a middle electrode is formed thereon and a second dielectric film and a top electrode are formed on the middle electrode, thereby having a three-layer electrode structure. The capacitor according to the present invention has variable capacitance in accordance with a voltage applied to top, bottom and middle electrodes, respectively.

20 Claims, 5 Drawing Sheets

CAPACITOR FOR SEMICONDUCTOR DEVICE AND FABRICATION METHOD THEREOF

BACKGROUND OF THE INVENTION

1. Field of the Invention

The present invention relates to a semiconductor device, and more particularly to a structure and fabrication method of a capacitor which has variable capacitance in accordance with an electrode connection.

2. Description of the Conventional Art

FIG. 1 is a diagram illustrating a structure of a conventional capacitor.

As shown therein, a semiconductor substrate 100 consists of an active region 101 and an isolation region 102 on which a field oxide film 102a is formed by a local oxidation of silicon (LOCOS) process. A gate oxide film 103 is formed on the active region 101 of the semiconductor substrate 100 and a gate electrode 104 is formed thereon. A source/drain 104a is formed in the semiconductor substrate 100 at both sides of the gate electrode 104. A lower electrode 105 of a capacitor C is formed on the isolation region, that is, the field oxide film 102a and a dielectric film 106 and an upper electrode 107 are sequentially formed on the lower electrode 105, the lower and upper electrodes 105 and 107 being formed of polysilicon. Further, an insulating film 108 is formed over the gate electrode 104 and an entire surface of the capacitor C and contact holes 109 are respectively formed in the insulating film 108 on predetermined portions of the upper electrode 107 and the source region 104a. Conductive plugs 110 are filled in the contact holes 109, the conductive plugs 110 being connected to each other by a conductive wire 111.

As shown in FIG. 1, the capacitance of the conventional capacitor is proportional to an area in which the upper and lower electrodes face to each other and a dielectric constant of the dielectric film. However, the conventional capacitor has disadvantages as follows.

That is, since the capacitor is formed on the field oxide film having a step difference which is higher than that of the active part, the step difference between the level of the field oxide film and the active region becomes large after fabricating the capacitor, which affects a planarization in the semiconductor device fabrication process.

In addition, as the integration of the semiconductor device increases, a dimension of the field oxide isolation region becomes smaller and accordingly the capacitance is decreased. Thus, in the conventional capacitor, the area occupied by the semiconductor substrate is unavoidably enlarged to increase the capacitance, thereby impeding the high-integration of the semiconductor device.

Further, since the conventional capacitor has the predetermined capacitance, a complicated circuit must be additionally provided to change the capacitance of the capacitor and thus the number of patterns applied on the semiconductor substrate increases, which results the hindrance of the high-integration of the semiconductor device.

SUMMARY OF THE INVENTION

Accordingly, the present invention is directed to a structure and fabrication method of a capacitor which obviates the problems and disadvantages in the conventional art.

An object of the present invention is to provide a capacitor that improves a step difference between a field oxide film and an active region to obtain planarized surface in a semiconductor device fabricating process and thereby improve the reliability of the semiconductor device.

Another object of the present invention is to provide a capacitor that obtains capacitance which is higher than a conventional capacitor with the same area.

Another object of the present invention is to provide a capacitor that varies capacitance in accordance with user's intention without adding a complicated circuit.

To achieve these and other advantages and in accordance with the purpose of the present invention, as embodied and broadly described herein, there is provided a capacitor which includes a bottom electrode formed in a device isolation region of a semiconductor substrate, a first dielectric film formed on the bottom electrode, a middle electrode formed on the first dielectric film, a second dielectric film formed on the middle electrode, and a top electrode formed on the second dielectric film.

Here, the capacitor is formed on the semiconductor substrate having a trench in which an insulating film is filled and the bottom electrode is buried in the insulating film. In addition, two of the top, bottom and middle electrodes is applied with the same voltage.

Also, to achieve the above objects of the present invention, there is provided a fabrication method of a capacitor, which includes forming a trench on a semiconductor substrate, forming a first insulating film having a predetermined thickness in the trench, forming a first conductive layer pattern on the first insulating film, forming a second insulating film pattern on the first conductive layer pattern, forming a second conductive layer pattern on the second insulating pattern, forming an insulating film pattern on the second conductive layer pattern, and forming a third conductive layer on the insulating film pattern.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
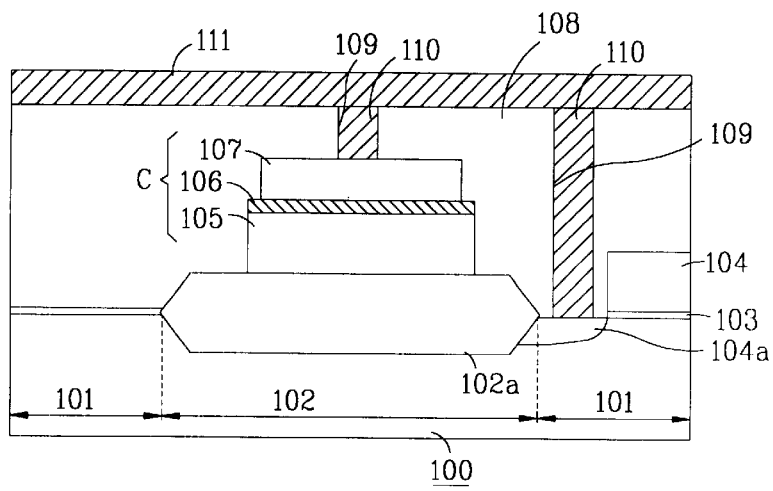
FIG. 1 is a cross-sectional view illustrating a conventional capacitor.
Figure 2:
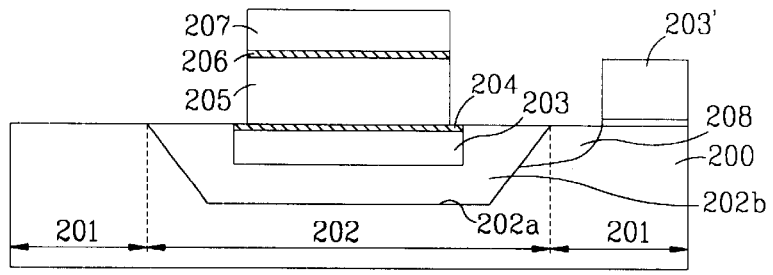
FIG. 2 is a cross-sectional view illustrating a capacitor according to a first embodiment of the present invention.

FIG. 2 is a cross-sectional view illustrating a capacitor according to a first embodiment of the present invention.

As shown therein, a semiconductor substrate 200 includes an active region 201 and an isolation region 202, which is fabricated in a device isolation method called a shallow trench isolation process. That is, a trench 202a is formed in the semiconductor substrate 200 and an insulating film 202b, which is an insulating film for isolating the semiconductor device, is filled in the trench 202a. A bottom electrode 203 of a capacitor C is buried in the insulating film 202b. A first dielectric film 204 is formed on the bottom electrode 203, a middle electrode 205 on the first dielectric film 204 and a second dielectric film 206 on the middle electrode 205. Further, a top electrode 207 is formed on the second dielectric film 206. 203' is a gate electrode and 208 is an impurity region corresponding to source/drain region.

A principle that capacitance of the capacitor C according to the first embodiment of the present invention varied is as follows.

When an identical voltage, for example, a positive voltage, is applied to the top electrode 207 and the bottom electrode 203 and a opposite polarity voltage, for example, a negative voltage, is applied to the middle electrode 205, it is possible to obtain capacitance twice as much as the conventional capacitor while having the same area in the semiconductor substrate applied in the conventional art. That is, the capacitance is formed between the bottom electrode and the middle electrode and also between the middle electrode and the top electrode. However, if the same voltage is applied to the top and middle electrodes and the opposite voltage is applied to the bottom electrode, capacitance is not formed between the upper electrode and the middle electrode but between the middle electrode and the bottom electrode, thus the capacitance becomes half the capacitance of the case where the same voltage is applied to the upper and bottom electrodes. Also, when the same voltage is applied to the middle and bottom electrodes and the voltage opposite to the voltage applied to the middle and bottom electrode is applied to the top electrode, overall capacitance of the capacitance is the same as that formed between the top and middle electrodes. As described above, the capacitor according to the present invention is a variable capacitance capacitor which obtains different capacitance with the same capacitor in accordance with the voltage application combination of the top, bottom and middle electrodes.

A fabrication method of the capacitor according to the first embodiment of the present invention will now be described with reference to the accompanying drawings.

FIGS. 3A to 3J are diagrams sequentially illustrating a process of fabricating the capacitor according to the first embodiment of the present invention.

Figure 3A:
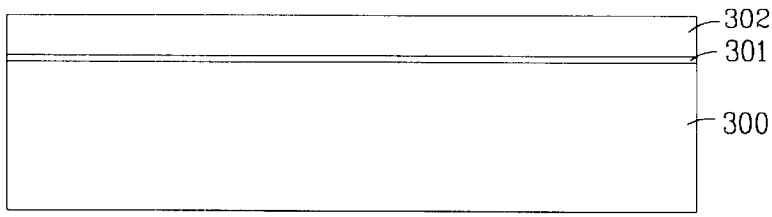
FIGS. 3A to 3J are diagrams sequentially illustrating a process of fabricating a capacitor according to the first embodiment of the present invention.

First, as shown in FIG. 3A, a silicon dioxide film $SiO_2$ is formed as a pad oxide film 301 on a semiconductor substrate 300 and a silicon nitride film $Si_3N_4$ 302 is formed on the pad oxide film 301.

Figure 3B:
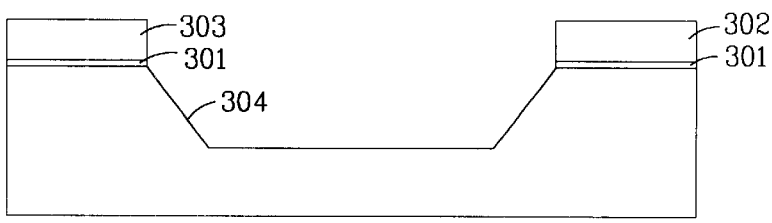

As shown in FIG. 3B, the silicon nitride film 302 is patterned to form a nitride film pattern 302a having a window 303 which corresponds to an isolation region of the semiconductor device, and then using the nitride film pattern 302a as a mask the semiconductor substrate 300 is etched, thereby forming a trench 304.

Figure 3C:
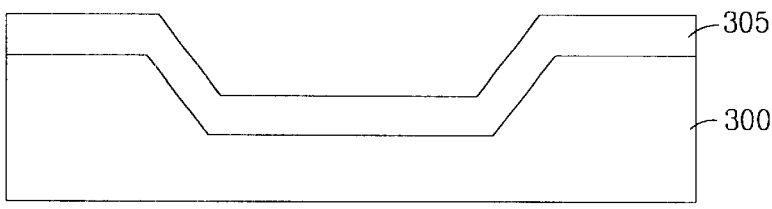

Next, as shown in FIG. 3C, the nitride pattern 302 and the pad oxide film 301 are removed and a first insulating film 305 is deposited over the semiconductor substrate 300 including the trench 304. Here, it is desirable that a material of the first insulating film 305 is a silicon oxide film formed by a thermal oxidation process or a silicon oxide film formed by a low pressure chemical vapor deposition process. Also, when depositing the first insulating film 305, the first insulating film in the trench 304 is preferably formed to be thinner than the trench.

Figure 3D:
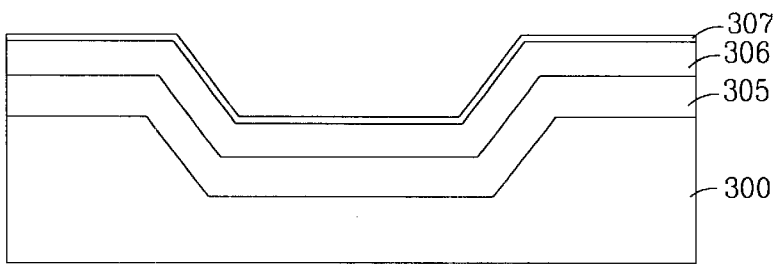

As shown in FIG. 3D, a first polysilicon layer 306 is formed over the first insulating film 305 and a second insulating film 307 is formed thereon. A material of the second insulating film 307 is an oxide/nitride/oxide film (hereinafter, referred to an ONO film), the second insulating film 307 being used as a first dielectric film of the capacitor. The ONO film is suitable for the second insulating film because the capacitance uniformity thereof is excellent.

Figure 3E:
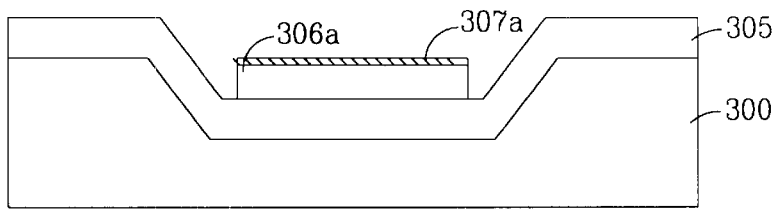
Figure 3F:
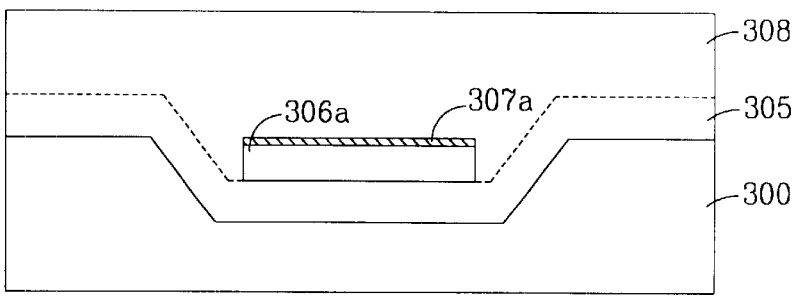

As shown in FIG. 3E, the second insulating film 307 and the first polysilicon layer 306 are patterned so that a second insulating film pattern 307a and a first polysilicon layer pattern 306a remain only on an inner portion of the trench 304. Further, as shown in FIG. 3F, a third insulating film 308 is formed over the resultant structure of the FIG. 3E, the third insulating film 308 having the same material as the first insulating film 305.

Figure 3G:
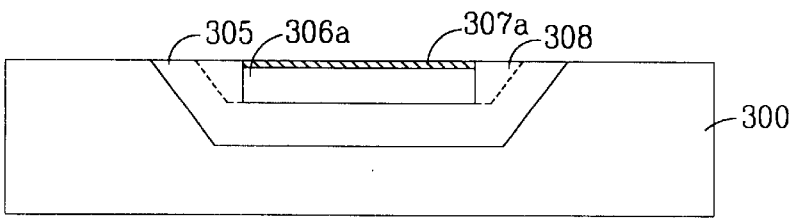

Next, as shown in FIG. 3G, a surface level of the semiconductor substrate 300 is planarized by a chemical mechanical polishing(CMP) process, which polishes the third insulating film 308 until the surfaces of the second insulating layer 307 and the second insulating film pattern 307a are exposed. Eventually, the material of the first insulating film 305 or the third insulting film 308 is filled in the trench 304 and the first polysilicon pattern 306a is buried by the first insulating film 305 or the third insulating film 308 filled in the trench 304, the first polysilicon pattern 306a corresponding to the bottom electrode 203 shown in FIG. 2 according to the first embodiment of the present invention.

Figure 3H:
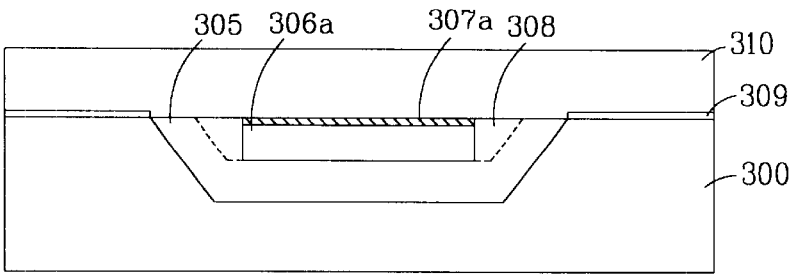

As shown in FIG. 3H, a heat treatment is performed to the resultant structure of FIG. 3G, thereby forming a thermally grown oxide film 309 which is to be used as a gate insulation film of a transistor by oxidizing the surface of the semiconductor substrate 300, and a second polysilicon layer 310 is formed on the oxide film 309, the second insulating film 307 and the second polysilicon layer pattern 310a.

Figure 3I:
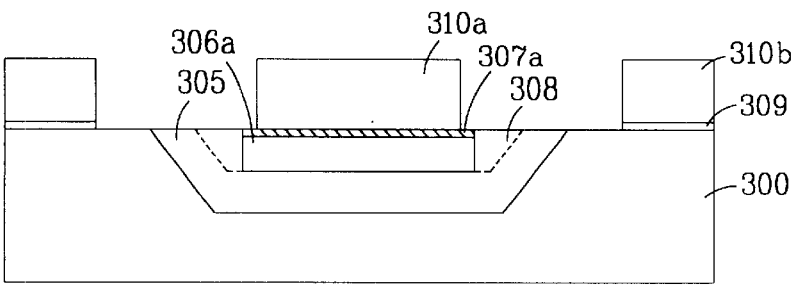

As shown in FIG. 3I, the second polysilicon layer 310 is patterned to form a second polysilicon layer pattern 310a on the second insulating film pattern 307a, the second polysilicon layer pattern 310a corresponding to the middle electrode 205 shown in FIG. 2. While forming the second polysilicon layer pattern 310a, a gate electrode 310b is applied on the gate insulating film 309 formed on the semiconductor substrate 300.

Figure 3J:
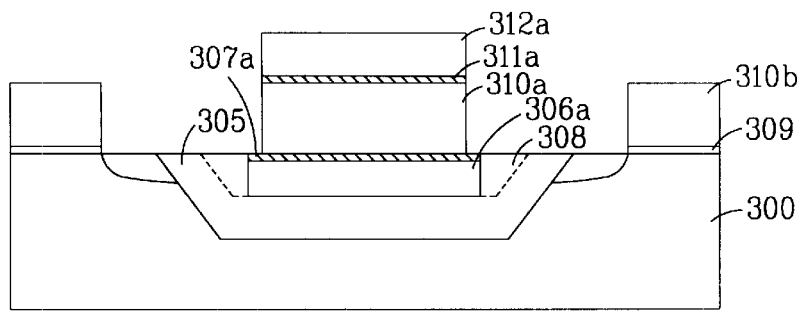

Finally, as shown in FIG. 3J, a fourth insulating film and a third polysilicon layer are sequentially formed on the resultant structure of the FIG. 3I and then patterned, thereby forming a fourth insulating film pattern 311a and a third polysilicon layer pattern 312a, respectively, on the second polysilicon layer pattern 310a, the fourth insulating pattern 311a and the third polysilicon layer 312a corresponding to the second dielectric film 206 and the top electrode 207, respectively, in FIG. 2. Here, it is desirable to use the ONO film as the fourth insulating film.

Figure 4:
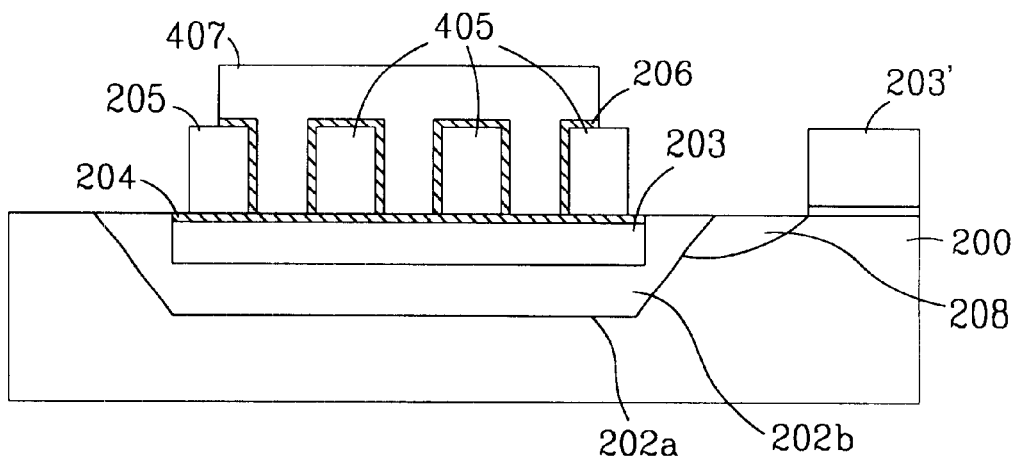
FIG. 4 is a cross-sectional view illustrating a capacitor according to a second embodiment of the present invention.

FIG. 4 is a cross-sectional view illustrating a capacitor according to a second embodiment of the present invention.

As shown therein, the capacitor according to the second embodiment of the present invention has the same constituent elements as in the first embodiment, except for which a middle electrode 405 and a top electrode 407 have different shapes from the middle electrode 205 and the top electrode 207 of the capacitor according to the first embodiment of the present invention. Accordingly, the elements which are the same as those in FIG. 2 will have the same reference numbers. In the second embodiment of the present invention, the middle electrode 405 has patterns of which a plurality of stakes are put up. The dielectric film 206 is formed on surfaces of each of the middle electrodes 405 and the top electrode 407 of the capacitor is formed over the overall surface of the dielectric film. Particularly, the top electrode 407 which is filled in the patterns of the middle electrode 405 has a comb shape. According to the second embodiment of the present invention, since the surface area where the middle electrode faces the top electrode is increased compared to the first embodiment, the capacitance thereof is accordingly greater than that of the capacitor according to the first embodiment of the present invention.

Figure 5:
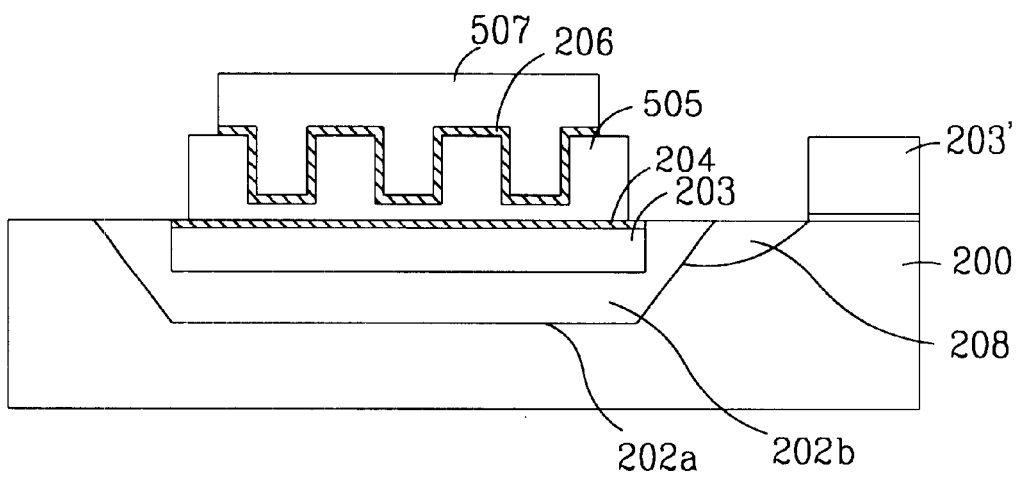
FIG. 5 is a cross-sectional view illustrating a capacitor according to a third embodiment of the present invention.

FIG. 5 is a cross-sectional view illustrating a capacitor according to a third embodiment of the present invention.

As shown therein, the capacitor according to the third embodiment of the present invention has the same constituent elements as in the second embodiment, except for which a middle electrode 505 has a different shape from the middle electrode 405 of the capacitor according to the second embodiment of the present invention. Accordingly, the elements which are the same as those in FIG. 3 will have the same reference numbers. The middle electrode 505 is formed in a comb shape. A dielectric film 206 is formed over the middle electrode 505. In addition, the middle electrode 505 and the top electrode 507 have the shape of which teeth of two combs bite facing each other. The capacitor according to the third embodiment of the present invention advantageously has greater capacitance than that of the first embodiment of the present invention.

As can be seen in the second and third embodiments of the present invention, the capacitor according to the present invention variously changes the shape of the middle electrode or the top electrode to enlarge the surface area thereof and thereby increases the capacitance.

Next, a fabrication method of the capacitor according to the second embodiment of the present invention will be described with reference to FIG. 5.

Figure 6A:
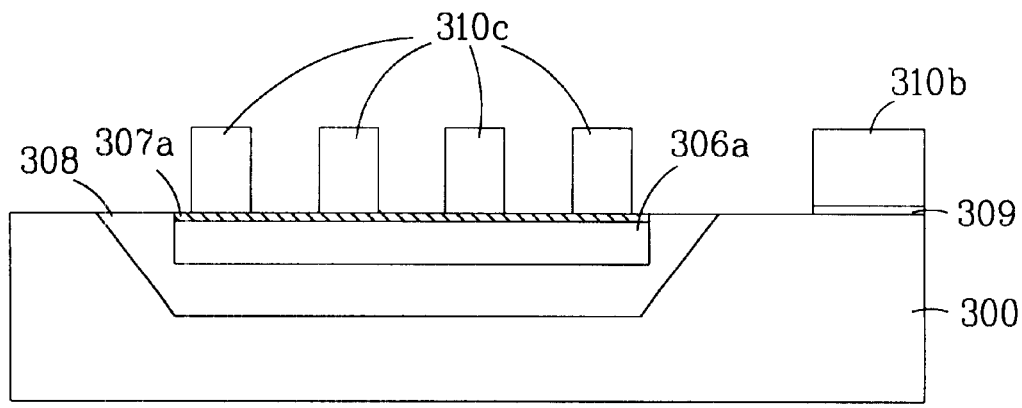
FIGS. 6A and 6B are diagrams sequentially illustrating a process of fabricating a capacitor according to the second embodiment of the present invention.
Figure 6B:
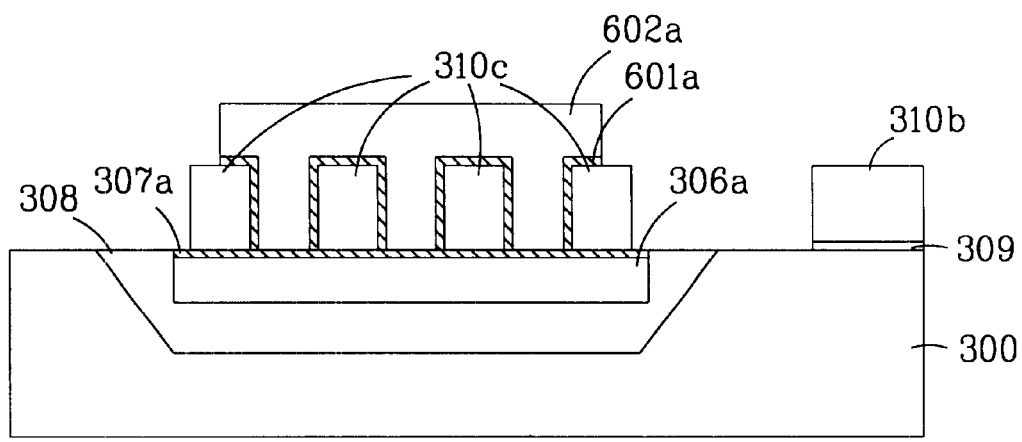

The fabrication method of the capacitor according to the second embodiment of the present invention adopts steps which are the same as the steps shown in FIG. 3A through FIG. 3H employed in the first embodiment of the present invention. Next, as shown in FIG. 6A, the second polysilicon layer 310 in FIG. 3H is patterned to form second polysilicon layer patterns 310b, 310c, the second polysilicon patterns 310c having patterns of a plurality of stakes which are separately put up on the second insulating film 307a (that is, the first dielectric film) or island shapes. Next, as shown in FIG. 6B, a third polysilicon layer and a fourth insulating film are formed on the overall surface of the resultant structure of FIG. 6A and then patterned, thereby forming a third polysilicon layer pattern 602a and a fourth insulating film pattern 601a, respectively. As described above, since in the capacitor according to the first embodiment of the present invention the bottom electrode is buried in the trench, the height of the capacitor is controlled, which results in reduction of the step difference of the elements formed on the active and isolation regions of the semiconductor substrate. Also, when the same voltage is applied to the bottom and top electrodes, the overall capacitance becomes a value that the capacitance between the bottom and middle electrodes is added to the capacitance between the middle and top electrodes, thus having an effect of increasing the capacitance compared to the conventional art while occupying the the same area on the semiconductor substrate as in the conventional art. While, when the same voltage is applied to the top and middle electrodes, the capacitance is formed between the middle and bottom electrodes, so that the capacitance becomes the same as the capacitance between the middle and bottom electrodes. In addition, when the same voltage is applied to the middle and bottom electrodes, so that the whole capacitance becomes the same as the capacitance between the top and middle electrodes. Thus, the capacitor according to the present invention has an effect of varying the capacitance in accordance with the combination of the applied voltage with the same electrode structure.

The capacitor according to the second and third embodiments of the present invention has an advantage of increasing the capacitance compared to the first embodiment, as well as having the same effects as the capacitor in the first embodiment, by forming the middle electrode in the stake or comb shape, thereby enlarging the surface area at its maximum. Thus, it is possible to obtain the desirable capacitance of the capacitor by variously forming the shape of the middle electrode besides the shape shown in the above embodiments of the present invention. For instance, although not illustrated, a hemispheric conductive film or a plurality of dimples can be formed on the middle electrode of the capacitor according to one of the above embodiments of the present invention, thereby increasing the surface area of the middle electrode and eventually fabricating a capacitor having high capacitance.

It will be apparent to those skilled in the art that various modifications and variations can be made in the capacitor for the semiconductor device and the fabrication method thereof of the present invention without departing from the spirit or scope of the invention. Thus, it is intended that the present invention cover the modifications and variations of this invention provided they come within the scope of the appended claims and their equivalents.

What is claimed is:

1. A capacitor comprising:
   a bottom electrode formed in a semiconductor substrate trench filled with an insulating film;
   a first dielectric film formed on the bottom electrode;
   a middle electrode formed on the first dielectric film;
   a second dielectric film formed on the middle electrode; and
   a top electrode formed on the second dielectric film.

2. The capacitor according to claim 1, wherein the capacitor is formed on a device isolation region of a semiconductor substrate.

3. The capacitor according to claim 1, wherein the bottom electrode is buried in the insulating film.

4. The capacitor according to claim 1, wherein two of the top, bottom and middle electrodes receive the same voltage.

5. The capacitor according to claim 1, wherein the same voltage is applied to the top and bottom electrodes.

6. The capacitor according to claim 1, wherein the same voltage is applied to the top and middle electrodes.

7. The capacitor according to claim 1, wherein the same voltage is applied to the middle and bottom electrodes.

8. The capacitor according to claim 1, wherein the top, middle and bottom electrodes are formed of polysilicon.

9. The capacitor according to claim 1, wherein the first dielectric film is a layered film formed of oxide/nitride/oxide.

10. The capacitor according to claim 1, wherein the second dielectric film is a layered film formed of oxide/nitride/oxide.

11. The capacitor according to claim 1, wherein the middle electrode is patterns of stakes which are separately put up.

12. The capacitor according to claim 1, wherein the middle electrode has a comb shape.

13. The capacitor according to claim 1, wherein each of the top and middle electrodes has a comb shape, the top and middle electrodes having the shape of which teeth of two combs bite facing each other.

14. A fabrication method of a capacitor, comprising the steps of:

forming a trench in a semiconductor substrate;

forming a first insulating film having a thickness in the trench;

forming a first conductive layer pattern on the first insulating film;

forming a second insulating film pattern on the first conductive layer pattern wherein an uppermost surface of the second insulating film pattern is coplanar with an uppermost surface of the semiconductor substrate;

forming a second conductive layer pattern on the second insulating film pattern;

forming an insulating film pattern on the second conductive layer pattern; and forming a third conductive layer pattern on the insulating film pattern.

15. The fabrication method according to claim 14, further comprising:

forming a third insulating film on the resultant structure which is obtained from the step of forming the second insulating film pattern; and applying a chemical mechanical polishing process to the third insulating film until an upper surface of the second conductive layer pattern is exposed.

16. The fabrication method according to claim 14, wherein the first insulating film is thinner than a depth of the trench.

17. The fabrication method according to claim 14, wherein the first, second and third conductive layer patterns are formed of polysilicon.

18. The fabrication method according to claim 14, wherein the second insulating film pattern is a layered film formed of oxide/nitride/oxide.

19. The fabrication method according to claim 14, wherein the insulating film pattern is a layered film formed of oxide/nitride/oxide.

20. The capacitor according to claim 1, wherein an uppermost surface of the first dielectric film is coplanar with an uppermost surface of the semiconductor substrate.

* * * * *